United States Patent [19]
Bonet et al.

[11] Patent Number: 5,093,152
[45] Date of Patent: Mar. 3, 1992

[54] PROCESS FOR PROTECTING AN OPTICAL SUBSTRATE BY PLASMA DEPOSITION

[75] Inventors: Claude Bonet, Rambouillet; Francois Coeuret, Guyancourt; Sylvie Nowak, Fontenay-le-Fleury; Jean-Marie Gauthier, Palaiseau, all of France

[73] Assignee: L'Air Liquide, Societe Anonyme pour l'Etude et l'Exploitation des Procedes Georges Claude, Paris, France

[21] Appl. No.: 536,942
[22] PCT Filed: Apr. 21, 1988
[86] PCT No.: PCT/FR88/00196
  § 371 Date: Nov. 21, 1988
  § 102(e) Date: Nov. 21, 1988
[87] PCT Pub. No.: WO88/08439
  PCT Pub. Date: Nov. 3, 1988

Related U.S. Application Data

[63] Continuation of Ser. No. 278,925, Nov. 21, 1988, abandoned.

[30] Foreign Application Priority Data

Apr. 22, 1987 [FR] France .................. 87 05669

[51] Int. Cl.$^5$ .................. B05D 3/06; B05D 5/06
[52] U.S. Cl. .................. 427/40; 427/39; 427/38; 427/164; 427/255.3; 427/255.2; 427/255.1; 427/307; 427/316; 427/45.1
[58] Field of Search .................. 427/39, 38, 40, 164, 427/167, 255.3, 255.2, 255.1, 307, 316, 45.1; 118/723

[56] References Cited

U.S. PATENT DOCUMENTS

| | | | |
|---|---|---|---|
| 4,328,646 | 5/1982 | Kaganowicz | 427/38 |
| 4,546,008 | 10/1985 | Saitoh et al. | 427/38 |
| 4,585,537 | 4/1986 | Nakayama et al. | 204/192 D |
| 4,645,684 | 2/1987 | Osada et al. | 427/38 |
| 4,668,365 | 5/1987 | Foster et al. | 204/192.23 |
| 4,673,588 | 6/1987 | Bringmann et al. | 427/41 |
| 4,716,048 | 12/1987 | Ishihara et al. | 427/39 |
| 4,816,341 | 3/1989 | Nakayama et al. | 428/458 |
| 4,840,873 | 5/1989 | Benz et al. | 427/35 |

FOREIGN PATENT DOCUMENTS

| | | |
|---|---|---|
| 0110258 | 6/1984 | European Pat. Off. . |
| 61-30671 | 2/1986 | Japan . |
| 61-077132 | 4/1986 | Japan . |
| 61-174510 | 12/1986 | Japan . |
| 61-186293 | 1/1987 | Japan . |
| 2071673 | 9/1981 | United Kingdom . |

OTHER PUBLICATIONS

"Thin Si Films Can Form at Room Temperature", Electronics, vol. 54(22), Nov. 1981, p. 82.
Tsu et al., "Silicon Nitride and Silicon Dimide Grown by Remote Plasma Enhanced Chemical Vapor Deposition", J. Vac. Sci. Technol. A, vol. 4(3), May 1986, pp. 480–485.
"Plasma Polymerization and Deposition of Amorphous Hydrogenated Silicon from rf and dc Silane Plasmas", Journal of Applied Physics, vol. 55, No. 10, May 1984, by R. Ross et al., pp. 3785–3794.

Primary Examiner—Shrive Beck
Assistant Examiner—Roy V. King
Attorney, Agent, or Firm—Young & Thompson

[57] ABSTRACT

Process for protecting a transparent optical substrate which is polymeric and has a vitreous transformation temperature and is selected from the group consisting of polycarbonate, polymethylmethacrylate, polystyrene acrylonitrile, crystalline polystyrene, polyimide, polyester, polyamide, polyvinyl chloride and glass, by deposition of an inorganic continous and transparent film consisting essentially of silicon, carbon, nitrogen, oxygen and hydrogen of the formula $Si\,C_x\,N_y\,O_z\,H_t$, in which x is between 0 and 5
  y is between 0.3 and 0.8
  z is between 1.3 and 2.5
  t is between 0.5 and 1.2.

A surface of the substrate is exposed to a plasma at a temperature below the temperature of vitreous transition of the substrate in the presence of precursors of Si, C, N, O and H is gaseous form, the precursor gas of the silicon being selected from the group consisting of $SiH_4$, $Si_2H_6$ and $Si_3H_8$, and the precursor gases of oxygen, hydrogen and carbon being selected from the group consisting of $O_2$, $N_2O$, $N_2$, $NH_3$, $CH_4$, $CO_2$ and $C_2H_6$.

5 Claims, 1 Drawing Sheet

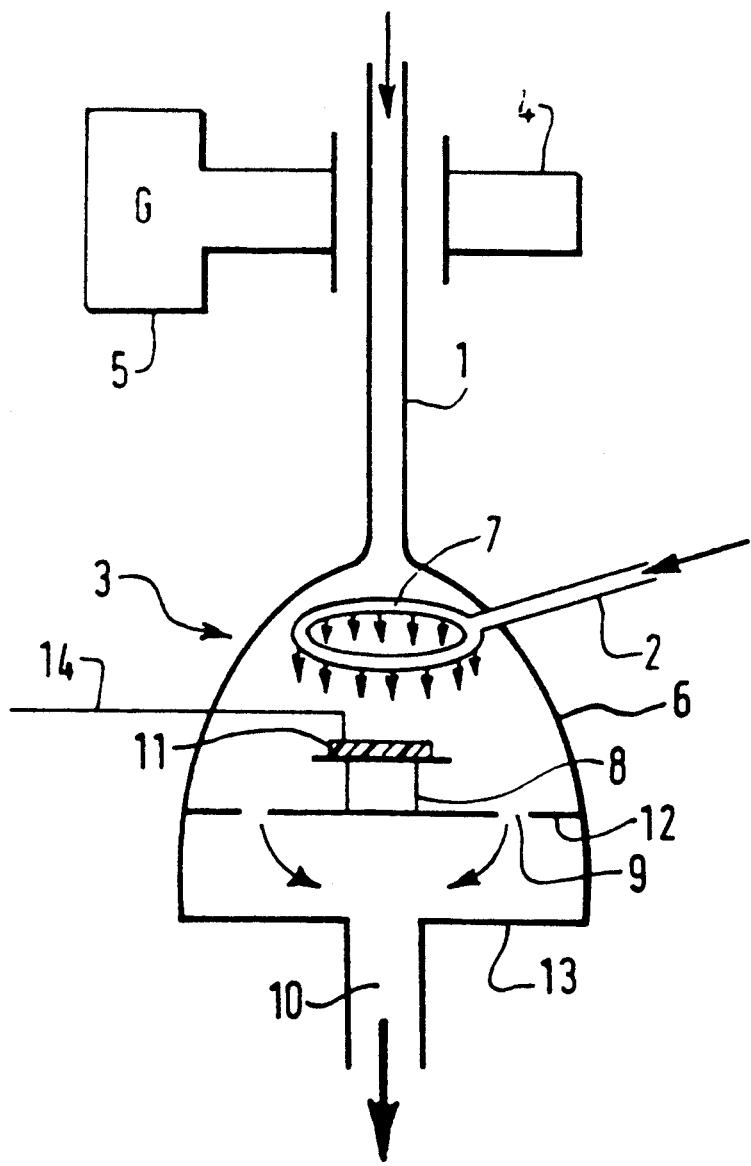

PROCESS FOR PROTECTING AN OPTICAL SUBSTRATE BY PLASMA DEPOSITION

This application is a continuation of application Ser. No. 278,925, filed Nov. 21, 1988, now abandoned.

The present invention relates to a process for protecting an optical substrate by plasma deposition.

In the microelectronic field, it is known to deposit by means of silanes amorphous compounds of silicon on crystalline silicon within a plasma at temperatures exceeding 200° C.

In the manufacture of holographic supports, it is known to achieve certain thin layers by plasma deposition, as described in the U.S. Pat. No. 4,330,604.

In the automobile industry, it is of particular interest to be able to replace glass, in particular for the glasses of headlight optical elements, by polymeric compounds which are lighter and more adapted to the elongated and rounded shapes of automobile accessories. However it is necessary to protect these polymeric compounds against chemical and mechanical attack by means of a transparent coating which has a suitable mechanical and thermal resistance. The patent application WO 85/04601 describes the realization of such a coating in two steps, i.e. a coating of the substrate to be protected by dipping in a silicone resin, then a hot polymerization of the coating.

For the manufacture of an information support for the electronic and data processing fields, for example magnetic supports, it is advantageous to provide the support with an essentially hard and antistatic coating.

The present invention is the discovery of a process it is possible to obtain hard, transparent, inorganic polymer deposits which resist thermal variations and humidity and are antistatic.

The present invention applies a protective coating for a substrate, of the type comprising essentially silicon, carbon, nitrogen, oxygen and hydrogen, having the formula $SiC_xN_yO_zH_t$, in which x is between 0 and 5
y is between 0.3 and 0.8
z is between 1.3 and 2.5
t is between 0.5 and 1.2

These coatings are obtained by a plasma deposition process for the deposition of a continuous and transparent film of an amorphous inorganic compound of the type comprising essentially the elements silicon, carbon, nitrogen, oxygen and hydrogen, characterized in that the surface of the substrate is exposed to a plasma at a temperature lower than the vitreous transition temperature of the substrate in the presence of gaseous precursors of these elements, the gaseous precursors coming from the substrate or extraneous sources.

The devices for practicing methods according to the invention for the plasma deposition of inorganic coatings on a substrate are characterized in that they comprise at least one sealed deposition enclosure connected in a sealed manner to at least two homogeneous injection paths at least one of which is provided with a means for forming a plasma, said enclosure comprising a homogeneous gas discharge orifice connected in a sealed manner to means for creating a depression in the enclosure, and a support for the substrate.

Homogeneous injection and discharge are intended to mean injections and discharges achieved in such manner that the gaseous composition is identical at any point of the surface to be coated.

The gaseous plasma may in accordance with the invention be produced by any known means and in particular by a radio-frequency excitation source or a microwave, for example.

The gas in which the plasma is created is a conventional plasma forming gas, such as for example the rare gases of the air for example argon or neon, or helium, or hydrogen and mixtures thereof.

However, it is also possible in accordance with the invention to create the plasma with the precursor gas, for example with the nitrogen, ammonia or oxygen.

The precursor gas of an element is intended to mean according to the invention a gas which contains this element and is capable of liberating it within the plasma. The different elements liberated by the different precursors are recombined to form the inorganic deposit. The elements therefore come from extraneous sources.

The gas which is the precursor of oxygen and/or nitrogen may be chosen in particular among $O_2$, $N_2O$, $N_2$ and $NH_3$, and there may be chosen as the precursor of carbon methane or ethane or $CO_2$. The precursor may be employed alone as plasma producing gas, and thus in certain cases the utilization of a conventional plasma producing gas is unnecessary.

Thus, the precursors of silicon may be the "silanes", i.e. apart from the silane $SiH_4$, the polysilanes such as $Si_2H_6$ and $Si_3H_8$, the halogenosilanes of the formula $SiX_nH_{4-n}$ in which $X = Cl$, F and n is less than or equal to 4, and, the organosilanes, for example $SiCl_3CH_3$ or triethylsilane.

Thus, and as will be seen in the examples, for depositing silica, $SiH_4$, $O_2$ and the plasma producing gas will be used; and for depositing silicon nitride, there will be used, in addition to the plasma producing gas, for example $N_2$ and $SiH_4$.

Lastly, it is also possible to envisage the deposition of compounds of silicon carbon, nitrogen, oxygen according to the invention from silanes and precursor(s) of oxygen, nitrogen and carbon.

But for realizing a coating according to the invention, the supply of the gaseous precursor element may be of another type, since the precursor elements may come from the substrate itself. Indeed, the polymeric substrates themselves produce under the effect of the plasma certain constituent elements of the coating. It is then only necessary to introduce in the gaseous form the complement necessary for obtaining coatings according to the invention by means of extraneous sources.

It has been discovered that the precursor or precursors of silicon in particular are advantageously injected as a post-discharge, i.e. the precursor or precursors are injected at the downstream end of the visible zone of the plasma jet.

Furthermore, it may be of utility, before effecting the deposit, to prepare the surface of the polymeric substrate by achieving a pre-treatment under the plasma, as will appear from the examples; this pre-treatment cleans the surface of the substrate and promotes the adhesion of the deposit. In particular, the pre-treatment with oxygen and with ammonia have been found effective for promoting the adhesion to the coating.

Likewise, it has been discovered, that a post-treatment with plasma may be advantageous in respect of the quality and adherence of the deposit, as well as a thermal post-treatment.

The process by means of a microwave plasma according to the invention is carried out at low pressure, i.e. preferably at less than 10 torr, and for example at a pressure on the order of less than 0.5 torr (1 torr = $1.33 \times 10_2$ Pa). This pressure is adapted according to the device employed for producing the plasma.

The temperatures on the surface of the substrate when carrying out the process according to the invention, in the case of the low pressure microwave plasma, for example are on the order of less than 100° C., and in particular lower than the temperatures of degradation of the surface to be treated, in particular lower than the vitreous transition temperature of the substrate when the latter is polymeric; the advantage of this is that it is possible to treat polymeric materials without cooling means when carrying out the process.

This low temperature process guarantees in particular the subsequent properties of the protected substrates.

The deposited films are inorganic and amorphous polymers. They are transparent and microscopically continuous and have a thickness on the order of from one tenth of a micrometer to a few micrometers. For a substrate of the polycarbonate type whose hardness according to Moh's scale is 2, that of the glass being 5 and 7, the film deposited according to the invention imparts thereto a hardness on the order of that of the glass. Their hardness is therefore in this case higher than that of the substrate.

The coatings are adherent to the substrate (the adhesive paper test) and resistant to abrasion. The following examples describe the temperature variations and the thermal cycles the coated substrates are capable of withstanding. It has been discovered that the presence of carbon in the coating results in a good resistance of the latter to thermal variations. When the supply of carbon is effected by an extraneous source, for example $CH_4$, the Si/C ratio coming from this extraneous source is preferably higher than or equal to 1.

These films moreover have water wettability properties superior to those of the substrate.

Apart from these properties, the applicant has shown that the coatings according to the invention have antistatic properties. This property is of interest for applications in microelectronics where the presence of electrostatic charges is particularly disadvantageous: plate support, printed circuit and card support, and generally any magnetic information storage means.

Owing to their hardness, they present certain advantages over the organic deposits used heretofore for the protection of data supports such as laser discs, magnetic tapes and other magnetic supports.

As they are transparent, these supports may be employed for the surface protection of any transparent parts particularly sensitive to dust and other elements retained on the surface by electrostatic charges.

The applications are not limited solely to objects of plastics materials: the surface of a glass object coated with such a deposit also becomes antistatic.

To obtain such properties of antistatic character, adherence and hardness and resistances to thermal cycles, the deposits for which X = 0.3–1; Y = 0.5–0.8; Z = 1.3–2 and T = 0.6–1 are of particular interest.

The process according to the invention ensures a good quality of the surface-film connection in normal or aggressive conditions: adherence, resistance to chemical baths, etc. Owing to the optical, mechanical and chemical properties of the deposited layer (adherence, hardness, resistance to abrasion, chemical resistance, etc), the deposited coating according to the invention constitutes an effective protection of the supports against mechanical or chemical attack, in particular as concerns the maintenance of the optical qualities (high transmission and low diffusion).

The polymeric substrates to be protected according to the invention are chosen particularly from the molded or formed transparent polymeric materials used in particular as a glass in vehicle headlight optical elements. It may concern materials of the polycarbonate type in particular, polymethylmethacrylate, acrylonitrile polystyrene or crystal polystyrene.

The polycarbonates are polymers for example of the poly-(oxycarbonyloxy-1,4-phenylene isopropylidene-1,4-phenylene) type or copolymers based on bisphenol A and a comonomer.

Other substrates may however be protected by an antistatic hard coating according to the invention. There may be in particular mentioned the polyamides, PVC, the polyesters such as polyethylenetherephthalate; the polyimides, but also the polycarbonate covered with aluminium and the substrates of silicone. Glass may also be mentioned.

The transparent materials may be used for glazing or screens, i.e. in addition to being used for the glasses of headlights or lenses, in particular for the visors of motorcycle helmets, cowlings for motorcycles, lateral fixed or movable window glasses or openable roofs of vehicles and aircraft portholes, the optical elements of municipal and domestic lighting, safety glass panes, screens and protections for indicating apparatus and panels, greenhouses, verandas and roofs of plastics and watch crystals or spectacle glasses which may be organic or inorganic, as non-limitative examples.

The invention may however also be applied to the protection of non-transparent materials owing to the fact that the coatings have in particular antistatic properties.

This is why the present invention also concerns the application of the coatings according to the invention in the protection of glazing and screens and for the protection against electrostatic charges.

A better understanding of the invention will be had from the single FIGURE, the reading of the detailed description and the following embodiments.

The single FIGURE represents a diagrammatic sectional view of an embodiment of a device for carrying out the aforementioned process.

The sealed enclosure 3 is formed by a bell 6 resting on a circular base 13. A first injection path 1 having the same axis as the bell 6 is connected to at least one source of gas, not shown. This injection path 1 extends through a waveguide 4 connected to a microwave generator 5. A second injection path 2 connected to at least one source of gas, not shown, extends through the wall of the bell 6 in a sealed manner and is provided at its end within the bell 6 with a gas flow distributor 7 of toric shape and provided with equispaced orifices.

The substrate 11 is placed on a support 8; the support 8 includes a support plate 12 provided with orifices 9 symmetrically spaced apart. The circular base 13 of the bell 6 has an orifice 10 for discharging effluents having the same axis as the bell and connected in a sealed manner to means for creating a depression in the enclosure, not shown. It may comprise for example a vacuum pump. A thermocouple 14 measures the temperature on the surface of the specimen 11 and extends through the bell with a sealed joint.

The structure described above permits carrying out the process in the following manner:

As will be clear from the examples, there enters through the path 1 a plasma producing gas which receives the microwave energy of the UHF generator G through the waveguide 4. Precursor gases may also be injected through this path 1. The path 2 and its distributor 7 permits injecting the silicon precursor gas and optionally helium or argon.

However, the path 2 may also permit the injection of plasma producing gas when only the path 1 is taken by the precursor gas. Preferably, the silicon precursor is injected as a post-discharge through the path 2.

The axial disposition of the injection path 1 and the distributor 7 of the injection path 2 are means for achieving a homogeneous injection of the gases. Likewise, the orifice 10, which is also axial, and the symmetrically arranged orifices 9 of the plate 12 contribute to the homogeneity of the discharge of the gases. The homogeneous flow of the gases controls the homogeneity of the deposit on the substrate 11 placed at the center of the produced flows.

Other variants, not shown, for example where the symmetry would not be cylindrical, or where the injection paths would be multiplied, may also be envisaged, it being necessary that their disposition take into account the shape, the size and the number of substrates to be treated, in the desire to obtain a homogeneity of the gaseous flows which determines the homogeneity of the deposit.

The means for creating the vacuum, not shown, outside the device, at the end of the orifice 10 permits regulating the pressure as a function of the rates of the gas flows.

There may be used according to the invention instead of the waveguide other known means for creating a microwave plasma or for creating another type of plasma.

Thus, in another variant, not shown, other means for creating plasma are used for exciting the column of gas, for example an inductor surrounding the injection path and supplied with radiofrequency current.

EXAMPLE 1

Deposition of silicon oxide

The conditions of the deposition in a device such as described in FIG. 1 are the following:
G = microwave generator 2.45 GHz
Pressure = $0.5 \times 10^2$ Pa
Total flow = 5 liter/hr (the % relate to the total flow)
P designates the power transmitted by the plasma
t the treating time,
$\Theta$ the temperature on the surface of the polycarbonate.

The gases employed are shown in the following table 1:

TABLE I

| PRE-TREATMENT | | | DEPOSITION | | | |
|---|---|---|---|---|---|---|
| GAS | P(W) | t(mn) | GAS | P(W) | t(mn) | $\Theta$(°C.) |
| Ar<br>+Ar + 10% $O_2$ | 200<br>200 | 1<br>1 | Path 1: 89% Ar + 10% $O_2$<br>Path 2: 1% $SiH_4$ | 50 | 30 | 89 |
| Ar<br>+Ar + 10% $O_2$ | 200<br>300 | 1<br>1 | Path 1: 10% $O_2$<br>Path 2: 89% Ar + 1% $SiH_4$ | 300 | 60 | 47 |
| Ar<br>+He + 60% $O_2$ | 200<br>400 | 1<br>1 | Path 1: 10% $O_2$<br>Path 2: 89% Ar + 1% $SiH_4$ | 300 | 30 | 46 |

EXAMPLE 2

Deposition of silicon oxynitride

The depositions were carried out under the same general conditions and for the particular conditions given in the accompanying Table II. The treated substrate specimens measure $5 \times 5$ cm and are of polycarbonate sold by General Electric under the name of LEXAN and by Bayer under the name of MAKROLON.

The deposits of silicon oxynitride from $N_2$ obtained as described hereinbefore are transparent and adherent and have been tested:

Adherence: good (adhesive ribbon test)

Transparency (visual inspection): excellent

Homogeneity (electron induced X-ray analysis): excellent

IR spectra (principal bands): SiN (around 900 cm$^{-1}$) Si—NH (3335 cm$^{-1}$; 1170 cm$^1$) SiO (1000—1100 cm$^{-1}$)

Resistance to distilled water: 72 hr at 60° C. No alteration of the coating of the first specimen. The adherence remains good.

Thickness: 1 to 5 $\mu$m depending on the duration of the deposition.

Density: not measured, probably only slightly dense.

Resistance to abrasion = the 7 specimens were tested from the point of view of the transmission and diffusion of light, before and after the abrasion test by means of sand and the method termed the shoe method. In the last columns of the table are shown the mean values of the variation of the specimens in transmission (T) and diffusion (D).

The specimens before and after abrasion must have variations of less than 10% in transmission and less than 4% in diffusion to be suitable according to this test. The prepared specimens meet these requirements very well.

TABLE II

| PRE-TREATMENT | | | DEPOSITION | | | | POST-TREATMENT | | | ABRASION TEST | |
|---|---|---|---|---|---|---|---|---|---|---|---|
| GAS | P(W) | t(mn) | GAS | P(W) | t(mn) | $\Theta$(°C.) | GAS | P(W) | t(mn) | T% | D% |
| Ar | 200 | 1.5 | Path 1: 29% Ar + 10% $N_2$<br>Path 2: 60% He + 1% $SiH_4$ | 80 | 60 | 81 | — | | | 3.3 | 1.6 |
| Ar<br>+Ar + 10 $N_2$ | 200<br>200 | 1.5<br>1.5 | Path 1: 29% Ar + 10% $N_2$<br>Path 2: 60% He + 1% $SiH_4$ | 80 | 60 | 78 | — | | | 1.0 | 2.0 |
| Ar<br>+Ar + 10% NH | 200<br>300 | 1.5<br>1.5 | Path 1: 29% Ar + 10% $N_2$<br>Path 2: 60% He + 1% $SiH_4$ | 80 | 60 | 83 | — | | | 1 | 2.4 |
| Ar<br>+Ar + 10% $NH_3$ | 200<br>300 | 1.5<br>1.5 | Path 1: 29% Ar + 10% $N_2$<br>Path 2: 60% He + 1% $SiH_4$ | 80 | 120 | 80 | — | | | 0.3 | 0.2 |

TABLE II-continued

| PRE-TREATMENT | | | DEPOSITION | | | | POST-TREATMENT | | | ABRASION TEST | |
|---|---|---|---|---|---|---|---|---|---|---|---|
| GAS | P(W) | t(mn) | GAS | P(W) | t(mn) | Θ(°C.) | GAS | P(W) | t(mn) | T% | D% |
| Ar | 200 | 1.5 | Path 1: 29% Ar + 10% $N_2$ | 80 | 60 | 80 | Ar | 50 | 10 | 0.3 | 1.3 |
|  |  | 1.5 | Path 2: 60% He + 1% $SiH_4$ |  |  |  |  |  |  |  |  |
| Ar | 200 | 1.5 | Path 1: 29% Ar + 10% $N_2$ | 80 | 120 | 90 | Ar | 50 | 30 | 2.9 | 0.9 |
|  |  |  | Path 2: 60% Ar + 1% $SiH_4$ |  |  |  |  |  |  |  |  |
| Ar | 200 | 1.5 | Path 1: 89% Ar + 10% $N_2$ | 80 | 60 | 92 | — |  |  | 2.9 | 1.7 |
|  |  |  | Path 2: 1% $SiH_4$ |  |  |  |  |  |  |  |  |

EXAMPLE 3

A deposition was effected according to the process on a 5×2 cm. specimen of polycarbonate according to the following sequence:

1) Ar plasma pre-treatment then Ar plasma treatment containing 10% of $NH_3$,
2) plasma deposition for 1 hr of a layer of thickness 0.9 μm and having the composition: Si $C_{0.5}N_{0.8}O_2H$ from a gaseous phase of composition: $SiH_4$=0.6%; Ar=69%; He=20.4%; $N_2$=10%. A microwave generator G at 2.45 GHz was used; The power transmitted by the plasma is 60 to 80 W.

The pressure is $0.15 \times 10^2$ Pa.

The specimen coated in this way is then placed in a thermal enclosure maintained at +25° C. so as to be subjected therein to a thermal cycling as defined below.
16 hr at +25° C.
Lowering from +25° C. to −25° C. at 0.6° C./m
1 hr at −25° C.
Heating from −25° C. to +80° C. at 1° C./m
1 hr at +80° C.
Return to +25° C.

The specimen is subjected to 10 consecutive cycles with no alteration.

EXAMPLE 3 bis

The same specimen when placed for 17 hr in an atmosphere of 100% RH (relative humidity) at +25° C. undergoes no alteration.

EXAMPLE 4

This example reveals the role of the carbon as concerns the mechanical properties and the behavior with respect to the environment of the deposits on polycarbonate.

A 5×2 cm. specimen of polycarbonate is covered with a deposit effected under the same conditions as in Example 3 at a pressure of $0.5 \times 10^2$ Pa, according to the following sequence:

1) Ar plasma pre-treatment then Ar plasma treatment containing 10% of $NH_3$,
2) plasma deposition for 1 hr of a layer having a thickness of 1.7 μm from a gaseous phase of composition: $SiH_4$=0.6%; $CH_4$=0.6%; $N_2$=10%; He=20.4%; Ar=68.4%

This very adherent specimen is successfully subjected to 8 consecutive thermal cycles (such as defined in Example 3). No alteration was found after 24 hours at 25° C. at 100% RH.

We claim:

1. A method for protecting a transparent optical substrate which is polymeric and has a vitreous transformation temperature and is selected from the group consisting of polycarbonate, polymethylmethacrylate, polystyrene acrylonitrile, crystalline polystyrene, polyimide, polyester, polyamide, and polyvinyul chloride, by depositing on said substrate an inorganic continuous and transparent film consisting essentially of silicon, carbon, nitrogen, oxygen and hydrogen or the formula Si $C_x N_y O_z H_t$, in which
   x is between 0 and 5
   y is between 0.3 and 0.8
   z is between 1.3 and 2.5
   t is between 0.5 and 1.2,
comprising establishing a plasma jet having a visible zone from a first stream of gas containing at least one reactive gas selected from the group consisting of $O_2$, $N_2O$, $N_2$, $NH_3$, $CH_4$, $CO_2$ and $C_2H_6$, exposing a surface of said transparent optical substrate to said plasma jet at a temperature below the temperature of vitreous transition of the substrate, and separately and simultaneously injecting a second stress of gas containing a silicon precursor gas adjacent said exposed surface of said substrate and at the downstream end of the visible zone of the plasma jet.

2. The method of claim 1, wherein said exposed surface is maintained at a temperature not exceeding 150° C.

3. The method of claim 1, wherein said silicon precursor gas is a silane.

4. The method of claim 3, wherein
   x is between 0.3 and 1
   y is between 0.5 and 0.8
   z is between 1.3 and 2
   t is between 0.6 and 1.

5. The method of claim 3, comprising the preliminary step of effecting a pre-treatment of said exposed surface with plasma.

* * * * *